United States Patent [19]

Ingwersen

[11] Patent Number: 5,006,805
[45] Date of Patent: Apr. 9, 1991

[54] SURFACE COIL ARRANGEMENT FOR USE IN A NUCLEAR MAGNETIC RESONANCE APPARATUS

[75] Inventor: Hartwig Ingwersen, Uttenreuth, Fed. Rep. of Germany

[73] Assignee: Siemens Aktiengesellschaft, Berlin and Munich, Fed. Rep. of Germany

[21] Appl. No.: 409,925

[22] Filed: Sep. 20, 1989

[30] Foreign Application Priority Data

Sep. 23, 1988 [DE] Fed. Rep. of Germany ....... 3832473

[51] Int. Cl.$^5$ ............................................. G01R 33/34
[52] U.S. Cl. ...................................... 324/322; 324/318
[58] Field of Search ........................ 324/318, 322, 307; 333/222, 235, 219

[56] References Cited

U.S. PATENT DOCUMENTS

| | | | |
|---|---|---|---|
| 4,373,163 | 2/1983 | Vandebult | 343/842 |
| 4,558,278 | 12/1985 | Young | 324/307 |
| 4,712,069 | 12/1987 | Kemner et al. | 324/322 |
| 4,775,837 | 10/1988 | Boschmann | 324/322 |
| 4,816,766 | 3/1989 | Zabel et al. | 324/318 |
| 4,825,162 | 4/1989 | Roemer et al. | 324/318 |
| 4,839,594 | 6/1989 | Misic et al. | 324/322 |

FOREIGN PATENT DOCUMENTS

| | | | |
|---|---|---|---|
| 0218290 | 4/1987 | European Pat. Off. | |
| 0222982 | 5/1987 | European Pat. Off. | 324/318 |

OTHER PUBLICATIONS

"Doubly Tuned Local Coils for MRI and MRS at 1.5 T," Grist, Magnetic Resonance Medicine, vol. 6, No. 3, Mar. 1988, pp. 253-264.

"Spatial Localization Using a 'Straddle Coil'," Friedrich et al., J. Mag. Res., vol. 77, No. 1, Mar. 1988, pp. 101-118.

"Rotator Cuff Tears: Preliminary Application of High-Resolution MR Imaging with Counter Rotating Current Loop-Gap Resonators," Kneeland et al., Radiology, 1986, pp. 695-699.

Primary Examiner—Michael J. Tokar
Assistant Examiner—Kevin D. O'Shea
Attorney, Agent, or Firm—Hill, Van Santen, Steadman & Simpson

[57] ABSTRACT

A surface coil arrangement for use in a nuclear mangetic resonance apparatus includes two identically constructed surface coils arranged geometrically anti-parallel and electrically connected to each other so that radio-frequency magnetic fields which penetrate both coils do not generate any resultant (difference) current. Each surface coil is formed by a coaxial line section in a loop, with the jacket shielding of the coaxial line having a gap at one location in the loop. Both the inner conductor and the jacket shielding at one end of each section are electrically connected to the jacket shielding at the other end of that coaxial line section.

9 Claims, 2 Drawing Sheets

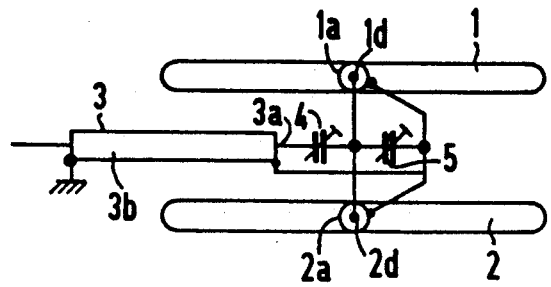
FIG 4
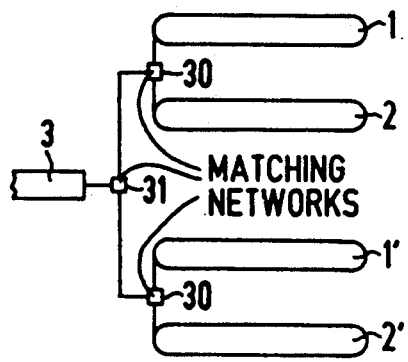
FIG 5
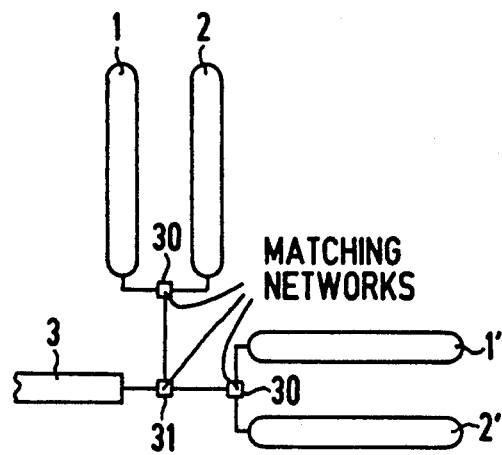
FIG 6
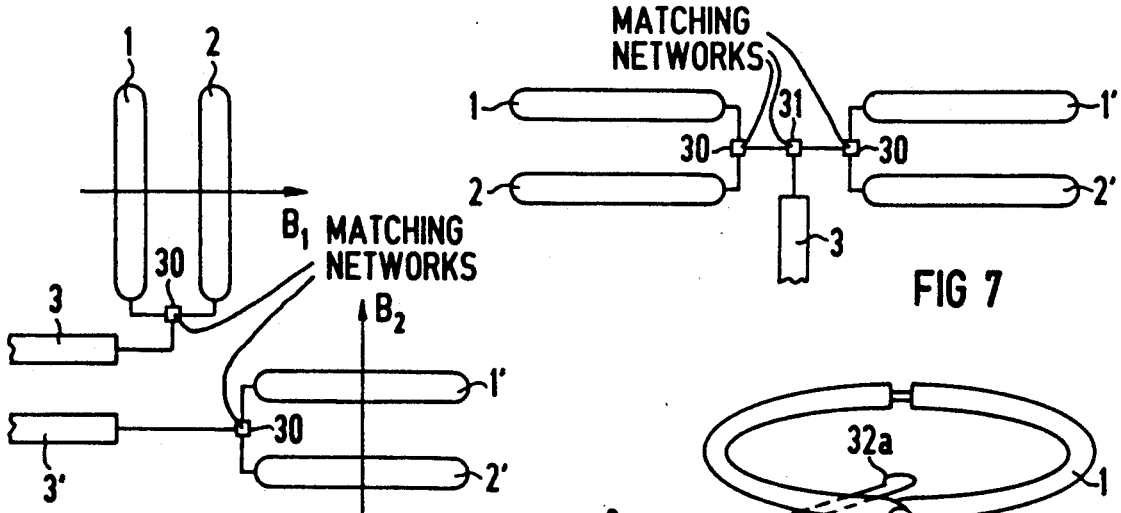
FIG 7
FIG 8
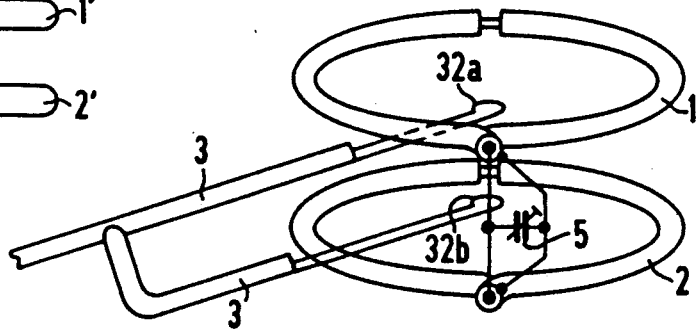
FIG 9

SURFACE COIL ARRANGEMENT FOR USE IN A NUCLEAR MAGNETIC RESONANCE APPARATUS

BACKGROUND OF THE INVENTION

1. Field of the Invention

The present invention is directed to a surface coil arrangement of type suitable for transmitting and receiving radio-frequency signals in a nuclear magnetic resonance apparatus.

2. Description of the Prior Art

A surface coil arrangement for conducting an arrangement of a subject in a nuclear magnetic resonance tomography apparatus is described in the article "Rotator Cuff Tears, Preliminary Application of High-Resolution MR Imaging with Counter Rotating Current Loop-Gap Resonators," Kneeland et al., Radiology, 1986, pages 695–699. This surface coil arrangement consists of two identically constructed surface coils arranged geometrically anti-parallel relative to each other, and being electrically connected to each other so that high-frequency magnetic fields which uniformly penetrate both surface coils do not generate a resultant current.

In the use of surface coils for receiving nuclear magnetic resonance signals and whole-body antennas for exciting nuclear magnetic resonance signals in an examination subject, it is a constant problem to decouple the surface coil from the radio-frequency transmitting field. If this is not done, the current induced in the surface coil would generate a radio-frequency field which would be superimposed on the excitation field. This would result in disturbances in the nuclear magnetic resonance imaging, as well as in nuclear magnetic resonance spectroscopy. Excessive local concentrations of the radio-frequency field acting on the patient could also be generated undesireably due to a surface coil in resonance. Moreover, damage to the reception system could be caused by over-voltages arising in the surface coil.

This problem can be avoided in linearly polarized radio-frequency fields by aligning the surface coil parallel to the excitation field. This solution, however, causes a number of operational limitations. Moreover this solution has no effect at all in circularly polarized excitation fields.

Two loop-gap resonators are described in the aforementioned article, which have identical areas and which are arranged geometrically anti-parallel to each other in an effort to solve this problem. The two resonators are electrically cross-connected at the gaps.

This coil arrangement is insensitive to irradiation by a uniform excitation field, but is more sensitive to the radio-frequency emission emanating from the examination subject in the reception mode. This can be explained by the following radio-frequency oriented considerations.

The electrical wiring of the two surface coils is geometrically anti-parallel, i.e., the respective loops forming the coils are wound in opposite directions. This results in two resonant circuits having the same resonant frequency. Due to the close geometric proximity of the coils, as well as the aforementioned circuit connection, a system of two highly coupled resonant circuits is achieved, which exhibits two separate resonant frequencies under the respective conditions of the current flowing the same direction in the coils, or the current flowing in opposite directions in the coils. Adjustment can be made so that the resonant frequency resulting from oppositely flowing currents is equal to the operating frequency of the nuclear magnetic resonance apparatus. The coil arrangement is thus sensitive for the reception of nuclear magnetic resonance radio-frequency signals from a non-uniform radio-frequency field distribution emanating from the examination subject, however, is not sensitive for the uniform excitation field which would excite isodirectional currents whose resonance frequency is sufficiently different from the operating frequency. The surface coil arrangement constructed in this manner is thus decoupled from the uniform excitation field independently of the position of the surface coil arrangement in relation to the field direction. This is also true for circularly polarized excitation fields.

The balancing as well as the line matching of surface coil arrangements is generally greatly dependent on the load represented by the examination subject. A rebalancing for each different examination subject is therefore generally required. This results in a lengthening of the examination times, and also introduces an uncertainty or fluctuation in the examination results, mainly caused by movements of the examination subject during the examination.

This surface coil arrangement is also sensitive to irradiation by electrical noise emission from external sources.

A surface coil which is only slightly detunable, and is thus relatively insensitive to noise radiation, is described in European application No. 0 222 982, corresponding to U.S. Pat. No. 4,816,766. This surface coil is formed by a coaxial line section shaped into a loop, and having jacket shielding with a gap or interruption at one location within the loop. Both the inside conductor and the jacket shielding at one end of the coaxial line section are electrically connected to the jacket shielding of the other end of the line section in the loop. Due to the action of the jacket shielding, this surface coil is insensitive to capacitive detuning due to external influences, as well as to external, electrical noise emissions. The problem of decoupling from the excitation field, however, remains.

SUMMARY OF THE INVENTION

It is an object of the present invention to provide a surface coil arrangement which is substantially insensitive to load-dependent capacitive detuning, and which is decoupled from a uniform excitation field.

The above object is achieved in accordance with the principles of the present invention in a surface coil arrangement having two surface coils each formed by a coaxial line section formed into a loop, with the jacket shielding of the conductor section having a gap or interruption at one location within the loop, and wherein both the inner conductor and the jacket shielding at the end of the coaxial line section forming the loop are electrically connected to the jacket shielding at the opposite end of that line section, and wherein the loops of the two surface coils in the arrangement have opposite winding directions.

In this arrangement, uniform radio-frequency excitation fields do not generate a resultant (difference) current, so that the arrangement can be arbitrarily oriented with respect to the excitation field, and can be employed in a circularly polarized excitation field. Due to the suppression of electrical field components by the jacket shielding, load-dependent detuning remains slight. Radio-frequency matching dependent on the examination subject is thus not required. No super-concentration of the field can ensue in the region of the surface coil as a consequence of the decoupling, so that a locally excessive load on the examination subject with radio-frequency radiation, or an over-voltage in the reception system, is not possible. Due to the decoupling, a more uniform image intensity distribution is achieved than with a single surface coil. Compared to known loop-gap resonators of the type described in the aforementioned Radiology article, a significantly flatter structure is obtained, because the relatively high ribbons or bands in the structure described in the Radiology article are replaced by relatively thin coaxial lines.

In a preferred embodiment, the inner conductors and the jacket shieldings of both surface coils in the arrangement are connected to each other, with the inner conductors of both surface coils being connected to the inner conductor of a coaxial feed line via a first tunable capacitor. The jacket shieldings of both surface coils in the arrangement are connected to the jacket shielding of the feed line, and a second tunable capacitor is connected between the inner conductors of the surface coils and their jacket shieldings. The surface coil arrangement can thus be adjusted to match the characteristic impedance of the feeder. Various other possibilities for inner connecting the surface coils of the arrangement to achieve a matching in a desired sensitivity range correlated to the examination subject are also disclosed.

DESCRIPTION OF THE DRAWINGS

FIG. 4 is a side view of the surface coil arrangement of FIG. 3 with a matching arrangement connected thereto.

FIGS. 5 through 8 show various further configurations of a surface coil arrangement constructed in accordance with the principles of the present invention.

FIG. 9 is a perspective view of the surface coil arrangement of FIG. 1 with a further embodiment of a matching arrangement.

DESCRIPTION OF THE PREFERRED EMBODIMENTS

Figure 1:
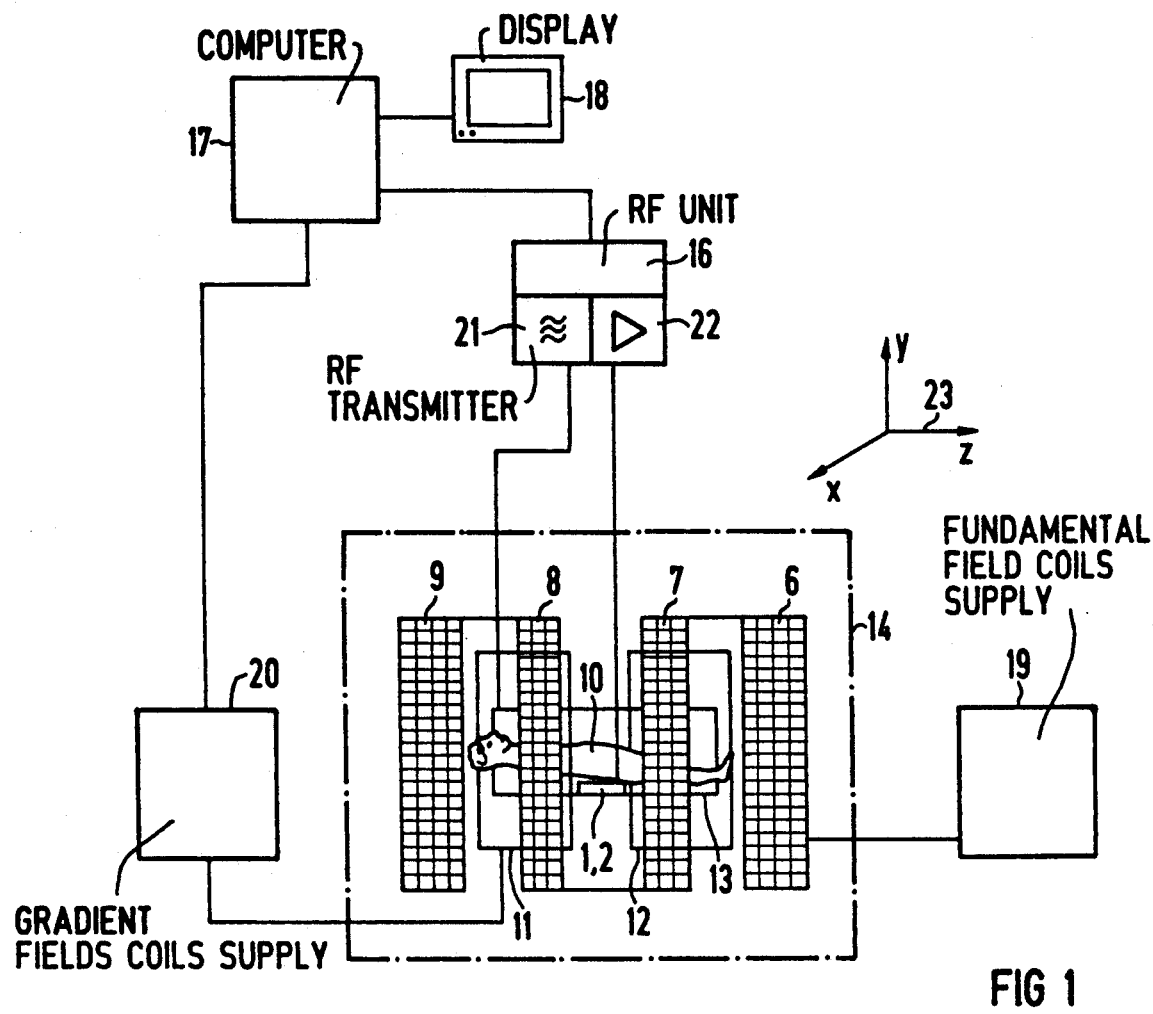
FIG. 1 is a schematic block diagram of a nuclear magnetic resonance apparatus in which a surface coil arrangement constructed in accordance with the priciples of the present invention can be used.

A nuclear magnetic resonance apparatus, in which a field coil arrangement constructed in accordance with the principles of the present invention can be used, is schematically shown in FIG. 1. A nuclear magnetic resonance tomography apparatus is shown in FIG. 1, however, it will be understood that the surface coil arrangement disclosed herein can be used in nuclear magnetic resonance spectroscopy devices as well. The apparatus of FIG. 1 includes fundamental magnetic field coils 6, 7, 8, and 9, which generate a fundamental magnetic field in which an examination subject 10, such as a patient, is disposed. Three sets of gradient coils are also provided which generate orthogonally magnetic field gradients in the x, y and z directions, according to the coordinate axis 23. For clarity, only gradient coils 11 and 12 are shown in FIG. 1, which generate the x-gradient in combination with a pair of identical gradient coils on the opposite of the patient. A set of y-gradient coils (not shown) is disposed above and below, and parallel to, the examination subject 10. A set of z-gradient field coils is disposed at the feet and head of the examination subject 10 transversely relative to the longitudinal axis of the examination subject 10. The apparatus also includes a body resonator 13 for generating nuclear magnetic resonance signals in the examination subject 10. A surface coil arrangement consisting of coils 1 and 2, shown in greater detail in other figures, is provided for receiving or acquiring the resulting nuclear magnetic resonance signals.

The coils 1, 2, 6, 7, 8, 9, 11, 12 and 13 bounded by the dot and dash line represent the actual examination instrument. This instrument is operated by an electrical arrangement which includes a power supply 19 for the fundamental field coils 6–9 and a power supply 20 for the gradient field coils. A radio-frequency transmitter 21, controlled by a process computer 17, is connected to the body resonator 13. The surface coil arrangement consisting of the coils 1 and 2 is also coupled to the process computer 17 via a signal amplifier 22. A display 18 is provided on which an image constructed by the computer 17 is visually portrayed. The transmitter 21 and the amplifier 22 form a radio-frequency unit 16 for signal transmission and reception.

Figure 2:
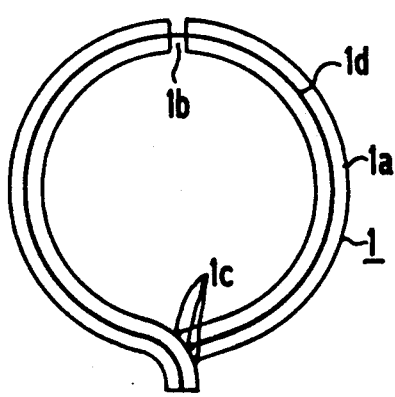
FIG. 2 is a plan view of a known individual surface coil.

An individual surface coil 1 is shown in plan view in FIG. 2, and is as described in the aforementioned U.S. Pat. No. 4,816,766. The coil 1 is formed by a coaxial line section shaped into a loop, with both the inner conductor 1d and the jacket shielding 1a at one end of the loop being electrically connected to the jacket shielding at the starting point 1c of the loop. The jacket shielding 1a has an interruption or gap at a location 1b opposite the starting point 1c of the loop.

This coil acts as a frame antenna which is provided with a coaxial shielding interrupted at a preferred location for the formation of defined transmission and reception characteristics of the alternating magnetic field, as well as for avoiding disturbances. The gap 1b in the shielding can be located at any arbitrary point of the loop, however, a symmetrical arrangement wherein the location of the gap is opposite the feed point of the loop improves the transmission and reception characteristics. The width of the gap 1b in the jacket shielding 1a preferably roughly corresponds to the distance of the inner conductor 1d from the jacket shielding 1a. The shielding established by the jacket shielding 1a capacitively decouples the coil from the examination subject, so that the resonant frequency of the coil is substantially independent of the examination subject. Moreover, the surface coil is uninfluenced by external electrical noise emissions, which may occur if the room in which the apparatus is being used is inadequately shielded.

Figure 3:
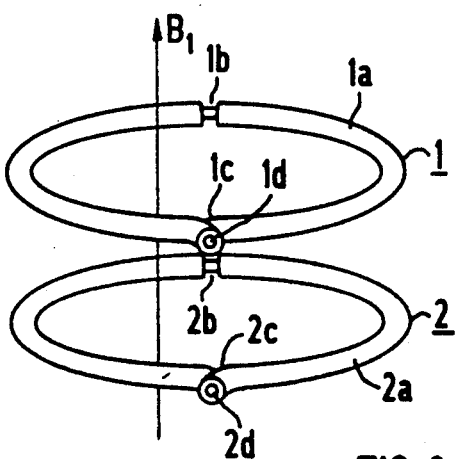
FIG. 3 shows a first embodiment of a surface coil arrangement constructed in accordance with the principles of the present invention.

FIG. 3 shows two identical surface coils 1 and 2 encompassing the same area which are arranged, in accordance with the principles of the present invention, geometrically anti-parallel relative to each other, i.e., the surface coils 1 and 2 are folded by 180° relative to each other so that the corresponding loops having different winding directions. The outputs of the surface coils 1 and 2 are connected in parallel, and are brought to resonance with a variable capacitor 5, as shown in FIG. 4. The capacitor 5 is adjusted so that oppositely directed, resonant currents flow at the operating frequency of the nuclear magnetic resonance apparatus, but such that the resonant frequency with isodirectional currents is sufficiently far away from this operating frequency. A radio-frequency field B1 uniformly penetrates the two surface coils 1 and 2, and therefore does not cause any resultant current in the arrangement. Because the excitation of the nuclei in the examination subject 10, for the purpose of generating nuclear magnetic resonance signals, is undertaken with whole-body antennas and with uniform excitation fields, the surface coil arrangement disclosed herein is thus decoupled from the excitation field independently of its orientation relative to the excitation field. This is also true for circularly polarized excitation fields.

The radio-frequency field distribution emanating from the examination subject due to nuclear magnetic resonance is, however, non-uniform. This field therefore does not penetrate the two surface coils 1 and 2 uniformly, so that a resultant current is induced and thus the nuclear magnetic resonance signal can be acquired with the surface coil arrangement.

A capacitive matching circuit is shown in FIG. 4 for matching the characteristic impedance of the surface coil arrangement to the characteristic impedance of a feed line 3. The inner conductors 1d and 2d and the jacket shieldings 1a and 2a are respectively connected to each other. The inner conductor 3a of the feed line 3 is connected to the two inner conductors 1d and 2d via a tunable capacitor 4. The jacket shielding 3b of the feed line 3 is connected to the jacket shieldings 1a and 2a. The two inner conductors 1d and 2d are connected to the jacket shieldings 1a and 2a via a further tunable capacitor 5. The characteristic impedance of the surface coil arrangement consisting of the coils 1 and 2 can be matched to the characteristic impedance of the feed line 3 by tuning the capacitors 4 and 5.

Other combinations of surface coil arrangements constructed in accordance with the principles of the present invention, with which the sensitivity range can be adapted to a desired examination region, are shown in FIGS. 5–8.

In the arrangement of FIG. 5, two surface coil arrangements consisting of the coils 1 and 2 and the coils 1' and 2', are axially arranged in the form of a Helmholtz resonator. Matching of the coils to each other and to a coaxial feed line 3 is accomplished by matching networks 30 and 31. An especially uniform sensitivity zone can thus be achieved between the two surface coil arrangements respectively consisting of the coils 1 and 2 and the coils 1' and 2'.

In an arrangement as shown in FIG. 6, two surface coil arrangements consisting of coils 1 and 2 and of coils 1' and 2', are arranged at an angle of 90°, and are connected to a common feed line 3 via matching networks 30 and 31. Although an angle of 90° is shown in the exemplary embodiment of FIG. 6, the angle between the coil arrangements consisting of the coils 1 and 2 and the coils 1' and 2' can be arbitrarily selected.

A further arrangement is shown in FIG. 7, wherein two surface coil arrangements respectively consisting of the coils 1 and 2 and the coils 1' and 2', are arranged in a plane, and are again connected to a common feed line 3 via matching networks 30 and 31.

In the arrangement of FIG. 8, two surface coil arrangements, again consisting of coils 1 and 2 and coils 1' and 2' are arranged at a right angle relative to each other. Each surface coil arrangement is provided with a separate, respective feed line 3 or 3'. By inserting a 90° phase line, or another arbitrary component into a connecting line which produces a phase shift of 90°, circular transmission or reception can be undertaken within a certain volume in which both field components are perpendicular relative to each other. Circular transmission and reception can also be achieved with suitable switching from 90° to −90°.

An embodiment in shown in FIG. 9 for inductively coupling a surface coil arrangement consisting of coils 1 and 2 to a transmission line 3. The inner conductor of the transmission line 3 is formed into a wire loop 32a, and is conducted back to the jacket shielding of the line 3. The wire loop 32a is arranged in the proximity of the surface coil 1, so that the connecting line 3 is inductively coupled to the surface coil 1. For symmetry, a second wire loop 32b can be provided which is inductively coupled to the other surface coil 2. The inner conductors 1d and 2d and one end of the jacket shielding 1a and 2a are connected to the opposite end of the jacket shieldings 1a and 2a via tunable capacitor 5. The surface coil arrangement can be balanced to a desired resonant frequency using the tunable capacitor 5.

A further use of the surface coil arrangement disclosed herein is possible with matching circuits with which the surface coil arrangement can be simultaneously set to two different resonant frequencies. The two "natural" resonant frequencies of the arrangement can be used. For example, proton imaging and phosphorous spectroscopy can be undertaken in rapid succession, or simultaneously, with the same arrangement without changing the surface coil. A matching circuit for two operating frequencies is disclosed, for example, in German OS 36 34 030.

In addition to use in the reception mode, the surface coil and all variations thereof disclosed herein are suitable for use in the transmission mode. Corresponding transmission/reception switching means are usually present in nuclear magnetic resonance tomography systems. This can also be used in nuclear magnetic resonance spectroscopy when methods based on a non-uniform excitation of an examination subject by the surface coil are used in addition to the uniform excitation field.

Although modifications and changes may be suggested by those skilled in the art, it is the intention of the inventor to embody within the patent warranted hereon all changes and modifications as reasonably and properly come within the scope of their contribution to the art.

I claim as my invention:

1. A surface coil system for use in a nuclear magnetic resonance apparatus comprising a surface coil arrangement having two identically constructed surface coils, said coils being disposed geometrically anti-parallel and being electrically connected to each other so that radio-frequency magnetic fields which uniformly penetrate both surface coils do not induce any resultant current, each surface coil being formed by a coaxial line section formed in a loop and having jacket shielding with a gap at one location in said loop, said coaxial line section having an inner conductor and having an end at which the jacket shielding and the inner conductor are electrically connected to the jacket shielding at an opposite end of said coaxial line section, with the loops of said two surface coils having opposite winding directions.

2. A surface coil system as claimed in claim 1, wherein the inner conductors of each of said coils are electrically connected and wherein the jacket shielding of both of said coils are electrically connected, and further comprising a coaxial feed line and a first tunable capacitor connected between an inner conductor of said coaxial feed line and said connected inner conductors of said coils and the connected jacket shieldings of said coils are connected to a jacket shielding of said feed line, and further comprising a second tunable capacitor connected between the connected inner conductors of said coils and the connected jacket shielding of said coils.

3. A surface coil system as claimed in claim 1, wherein the inner conductors of said coils are electrically connected and wherein said jacket shieldings of said coils are electrically connected, and further comprising a tunable capacitor electrically connected between the connected inner conductors and the connected jacket shieldings of said coils, and further comprising a feed line having a free end in which an wire loop is formed and disposed relative to one of said surface coils for inductively coupling signals into and out of that surface coil.

4. A surface coil system as claimed in claim 3, further comprising a further feed line having a free end terminating in a further wire loop, said further feed line and said further wire loop being disposed relative to the other surface coil symmetrically relative to said wire loop and said one surface coil for symmetrically coupling signals into and out of both surface coils.

5. A surface coil system as claimed in claim 1, further comprising a further surface coil arrangement, identical to said surface coil arrangement, with the surface coils in said surface coil arrangement disposed in respective common planes with the surface coils in said further surface coil arrangement and matching networks connected between said surface coils and a feed line.

6. A surface coil system as claimed in claim 1, further comprising a further surface coil arrangement, identical to said surface coil arrangement, with the surface coils in said surface coil arrangement and said further surface coil arrangement all disposed aligned axially relative to each other, and matching networks connected between said coils and a feed line.

7. a surface coil system as claimed in claim 1, further comprising a further surface coil arrangement, identical to said surface coil arrangement, with the surface coils in said surface coil arrangement disposed relative to the surface coils in said further surface coil arrangement at an angle other than 0°, and matching networks connected between said coils and a feed line.

8. A surface coil as claimed in claim 1, further comprising a further surface coil arrangement, identical to said surface coil arrangement, with the surface coils in said coil arrangement disposed at an angle of 90° relative to the surface coils of the further surface coil arrangement, and a separate feed line for each of said coils.

9. A surface coil system as claimed in claim 1, further comprising a matching network connected between said coils and a feed line for simultaneous operation of said coils at two different resonant frequencies.

* * * * *